US007093225B2

(12) United States Patent
Osann

(10) Patent No.: US 7,093,225 B2
(45) Date of Patent: Aug. 15, 2006

(54) FPGA WITH HYBRID INTERCONNECT

(76) Inventor: Robert (Jr.) Osann, 10494 Ann Arbor Ave., Cupertino, CA (US) 95014

( * ) Notice: Subject to any disclaimer, the term of this patent is extended or adjusted under 35 U.S.C. 154(b) by 73 days.

(21) Appl. No.: 10/639,336

(22) Filed: Aug. 12, 2003

(65) Prior Publication Data

US 2004/0034843 A1    Feb. 19, 2004

Related U.S. Application Data

(60) Provisional application No. 60/403,777, filed on Aug. 13, 2002, provisional application No. 60/396,375, filed on Jul. 17, 2002.

(51) Int. Cl.
*G06F 17/50* (2006.01)
*G06F 9/45* (2006.01)

(52) U.S. Cl. .................. 716/19; 716/1; 716/8; 716/11; 716/12; 716/16; 716/17

(58) Field of Classification Search .................. 716/1, 716/2, 8–18, 19; 326/37–39, 41, 47
See application file for complete search history.

(56) References Cited

U.S. PATENT DOCUMENTS 6,020,755 A  *  2/2000  Andrews et al. .............. 326/39
6,093,214 A  *  7/2000  Dillon .......................... 716/17
6,236,229 B1    5/2001  Or-Bach ....................... 326/39
6,609,244 B1 *  8/2003  Kato et al. ..................... 716/18
6,744,278 B1 *  6/2004  Liu et al. ....................... 326/41
6,754,881 B1 *  6/2004  Kuhlmann et al. ........... 716/16
6,798,239 B1 *  9/2004  Douglass et al. ............. 326/39

* cited by examiner

*Primary Examiner*—Vuthe Siek

(57) ABSTRACT

An Application-Specific Field Programmable Gate Array (FPGA) device or fabric is described for use in applications requiring fast reconfigurability of devices in the field, enabling multiple personalities for re-using silicon resources (like arrays of large multipliers in DSP applications) from moment-to-moment for implementing different hardware algorithms. In a general purpose FPGA device or fabric, this fast reconfigurability is normally implemented by special reconfiguration support circuitry and/or additional configuration memory. Unfortunately, this flexibility requires a large amount of programmable routing resource and silicon area—limiting the viability in volume production applications. This invention describes how multi-program FPGA functionalities may be migrated to smaller die by constructing hybrid FPGA/ASIC implementations that retain the multi-program capability. Also described is a multi-program FPGA fabric architecture that uses a hybrid FPGA/ASIC interconnect structure, resulting in a much smaller silicon area when customized for a particular user application.

3 Claims, 8 Drawing Sheets

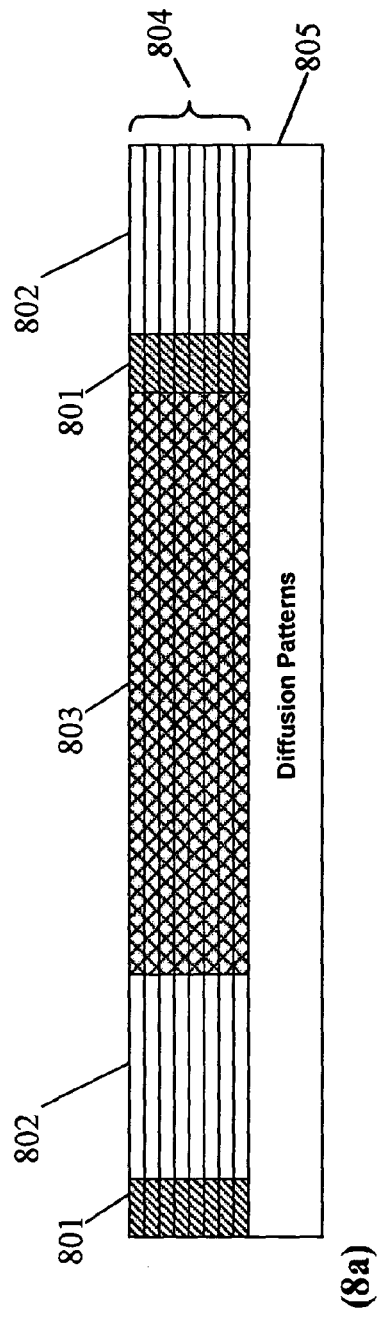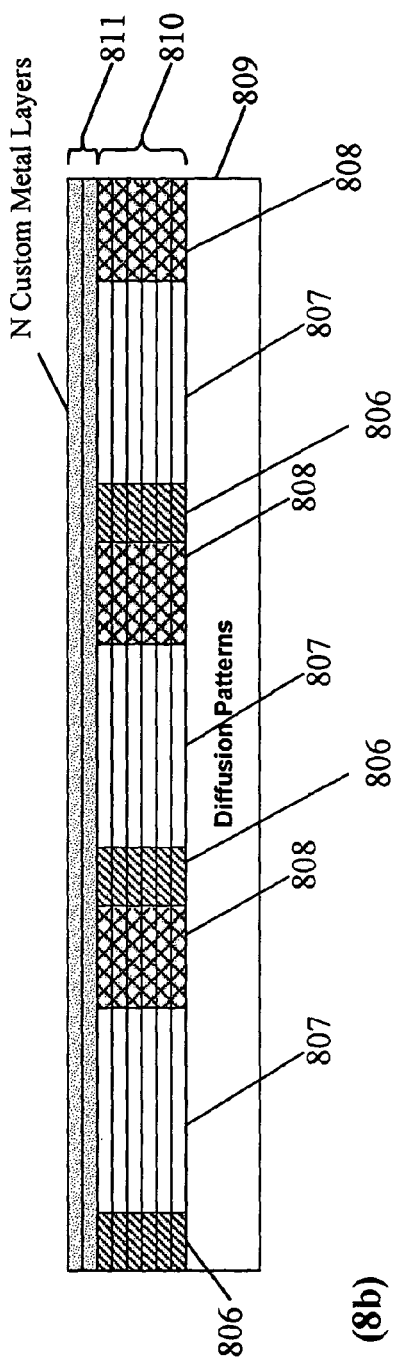
Figure 8

FPGA WITH HYBRID INTERCONNECT

CROSS REFERENCE TO RELATED APPLICATIONS AND DISCLOSURES

This application claims the benefit of U.S. Provisional Application Ser. No. 60/403,777, filed on Aug. 13, 2002, and entitled "Application specific multi-program FPGA," commonly assigned with the present invention and incorporated herein by reference.

This application also claims the benefit of U.S. Provisional Application Ser. No. 60/396,375, filed on Jul. 17, 2002, entitled "Reprogrammable instruction DSP with multi-program FPGA fabric" (recently filed as a utility patent entitled "Reprogrammable instruction DSP" on Jul. 16, 2003) and commonly assigned with the present invention and incorporated herein by reference.

Also, the present invention is related to that disclosed in Disclosure Document Ser. No. 522895, filed on Dec. 10, 2002, entitled "Hybrid FPGA" and incorporated herein by reference. It is requested that this document be retained for future reference.

FIELD OF THE INVENTION

This invention relates to the fields of Programmable Logic Devices (PLDs) including Field Programmable Gate Arrays (FPGAs) as well as custom and semi-custom logic devices, and in particular capabilities for reconfiguration of devices while maintaining acceptable silicon densities, cost, and performance.

BACKGROUND

Part of the historical vision of programmable hardware, (typically based on some form of FPGA technology), is that the reprogrammable fabric can remain programmable in production. One reason for this vision is that it allows adaptability to future (unforeseen) changes in functional requirements. This can also be extended to enabling changes "on-the-fly". Fast, on-the-fly reconfiguration can also enable the re-use of FPGA logic functionality for different purposes, from moment to moment and during normal execution, thereby increasing the effective silicon density of the FPGA. Changes on-the-fly allow the personality of the logic to be altered from moment-to-moment as different algorithms are required for different tasks, sometimes altering the personality in as little as a clock or two. The faster the FPGA can be reconfigured, the more its resources can be utilized for more than one user function, and the more the effective density is increased. This fast reconfiguration for increasing effective silicon density is especially useful in DSP (Digital Signal Processor) applications where many large multiplier functions are typically required, but if connected differently from moment to moment, can be re-used to implement different algorithms as required.

Conventional FPGA devices like those manufactured by Xilinx and Altera have been enhanced to allow somewhat faster reconfiguration and/or also partial reconfiguration. Also, some FPGA fabrics (the basic logic array structure) for use as IP (Intellectual Property) Cores in System On Chip (SOC) designs have been designed with provision for very fast full and/or partial configuration. However, these enhancements usually do not allow for major functionality changes within a clock or two. Even so, FPGA fabric providers like Elixent and Adaptive Silicon see their fast reconfiguration capability as valuable for re-using FPGA logic for different algorithms in the same application. Also, companies like PACT and GateChange see their fast partial-reconfiguration capability as useful for changing functions in real-time in a pipelined manner, so that the FPGA function can be altered as data propagates through the device. Chameleon offers a device that contains a full shadow memory for fast reconfiguration in a clock or two.

Unfortunately, the FPGA fabrics typically used in these solutions consume between 20 and 40 times as much silicon area as a standard-cell ASIC implementation normally used in high-volume SOC design. Very fast reconfiguration capability that is implemented without adding large amounts of additional memory requires an FPGA fabric architecture that has additional silicon area allocated to fast reconfiguration bus structures and sometimes additional memory to cache some of the reconfiguration data. Further, if it is desirable to alter the function of the FPGA fabric on-the-fly and within a clock cycle or two, additional configuration memory must be included in the FPGA fabric to implement the "multi-program" capability, increasing the consumption of silicon area even more.

Today, it remains to be seen if the value of full reprogrammability is economically viable for high-volume designs. The same is true for fast-reconfiguration FPGAs for multi-program implementations where full reprogrammability is retained for each personality—regardless of whether additional configuration memory is included or not. The silicon area penalties of retaining the capability for FPGA fabrics to implement any arbitrary functions are too great for most applications with any significant production volume.

There may come a time where fully-programmable multi-program (fast reconfiguration and/or multi-program memory) FPGA fabrics may become viable for SOC and FPGA volume production. However, in the meantime, there is a need for solutions that take advantage of the flexibility benefits of FPGA technology, while also providing an effective and practical solution for volume production. The promise of fast reconfiguration in FPGA fabrics for the purpose of re-using silicon resources (like arrays of large multipliers in DSP applications) may be fulfilled with acceptable device cost if the fabric can be tailored to the application.

Also, given the realities for very deep submicron design and the opinion of some experts that Moore's law (for semiconductor density and performance over time) is breaking down, it would be especially valuable if a device architecture were available that can implement multi-program functionality for a particular customer application, with acceptable silicon area for volume production, while requiring a limited number of custom masks for personalization.

SUMMARY

An Application Specific Field Programmable Gate Array (FPGA) device or fabric is described that is intended for use in applications requiring very fast reconfigurability of devices in the field, such that this FPGA fabric can effectively exhibit multiple personalities from time-to-time during normal use. These multiple personalities are especially valuable in re-using silicon resources (like arrays of large multipliers in DSP applications) from moment-to-moment for implementing different hardware algorithms.

In a general purpose FPGA device or fabric, this fast reconfigurability can be implemented by special reconfiguration support circuitry and/or additional configuration memory. Unfortunately, maintaining the capability for the FPGA to implement any arbitrary function for each personality requires a large amount of programmable routing resource and silicon area—limiting the viability in volume production applications.

This invention describes how multi-program FPGA functionalities may be migrated to smaller die by constructing hybrid FPGA/ASIC implementations that retain the multi-program capability. Also described is a multi-program FPGA fabric architecture that uses a hybrid FPGA/ASIC interconnect structure, resulting in a much smaller silicon area when customized for a particular user application.

BRIEF DESCRIPTION OF THE DRAWINGS

The present invention is described with respect to particular exemplary embodiments thereof and reference is accordingly made to the drawings in which:

FIG. 8 shows cross-section diagrams for a general purpose multi-program FPGA (8a) and an application specific multi-program FPGA (8b) according to this invention

DETAILED DESCRIPTION OF THE INVENTION

The general topic of reprogrammable hardware goes beyond simply using FPGA-style re-programmable logic to implement a function. In some implementations that have been described, it may be desirable to alter the device's functionality during operation—effectively creating a multi-program FPGA or FPGA fabric. Such dynamic alteration allows the hardware resources of the device to be used for a first functionality at one point in time, and a second functionality a few moments later, thus increasing the overall effective functionality without a proportionate increase in the device size. To successfully implement this re-use of hardware functionality, a very fast re-configuration time is generally required. This fast reconfiguration time may be implemented using special reconfiguration bus structures and support circuitry and/or additional configuration memory.

If an adequately fast reconfiguration time can be achieved utilizing special reconfiguration support circuitry, this is preferable to adding large amounts of additional configuration RAM. Special reconfiguration support circuitry typically includes an optimized reconfiguration bus structure and control circuit and sometimes some amount of cache RAM for burst transfer of configuration data.

When multiple configuration RAM images must be stored in a multi-program FPGA, this may be implemented with an SRAM structure where a primary RAM cell controls the current configuration of a connection point or logic function and a "shadow" RAM cell or cells can be loaded with alternate pattern(s) to be transferred into the primary configuration RAM very quickly—sometimes within a clock periods of two. Alternately, the configuration RAM may simply have multiple locations per controllable connection point or logic function control bit.

Figure 1:
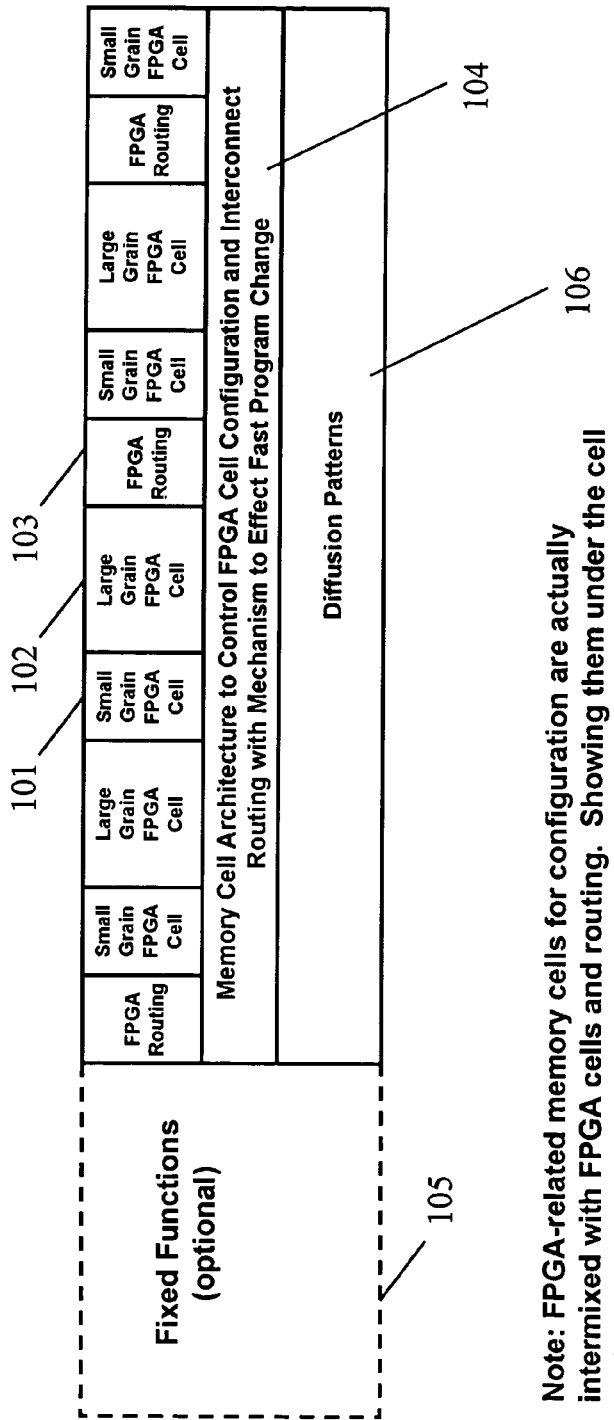
FIG. 1 describes the functionality for a general purpose multi-program FPGA fabric.

FIG. 1 shows a general purpose FPGA where the FPGA functionality is controlled by reconfiguration support circuitry that may include multiple numbers of memory cells per connection point and per logic function, or simply may include mechanisms for fast reconfiguration such that the FPGA functionality (or a portion thereof) can be quickly changed to a different configuration. Note that the cross section diagram of FIG. 1 shows a logical cross-section where the array of multiple memory cells 104 acts as a controlling layer for the FPGA functionality. In actuality, cells 104 are physically intermixed with the FPGA cells and routing.

If the implementation for FIG. 1 includes multiple memory cells per routing connection point, both small grain FPGA Cells 101 and large grain FPGA Cells 102 will be controlled by multiple sets of configuration memory cells, just as FPGA Routing connection points 103 are each controlled by multiple memory cells built on diffusion 106. Note that the FPGA-related memory cells for configuration purposes are actually intermixed with FPGA cells and routing. Showing them under the cell and routing switch functionality in FIG. 1 is a logical (not physical) way of signifying that the memory cells control the functionality of the FPGA fabric. Also, the multi-program FPGA of FIG. 1 may be designed for very fast reconfigurability by way of special structures and busses, in lieu of, or in addition to including more than one configuration memory cell per FPGA routing switch.

Note that this multi-program FPGA fabric, which will be described in more detail, can exist independently of any specific fixed functions 105, and could actually be embodied in an FPGA device containing only the multi-program FPGA fabric, or in an FPGA device also containing fixed functions such as memory and processor, or alternately may be embedded in a SOC ASIC as an independent IP core, or combined in some way with a conventional software programmable DSP processor.

Figure 2:
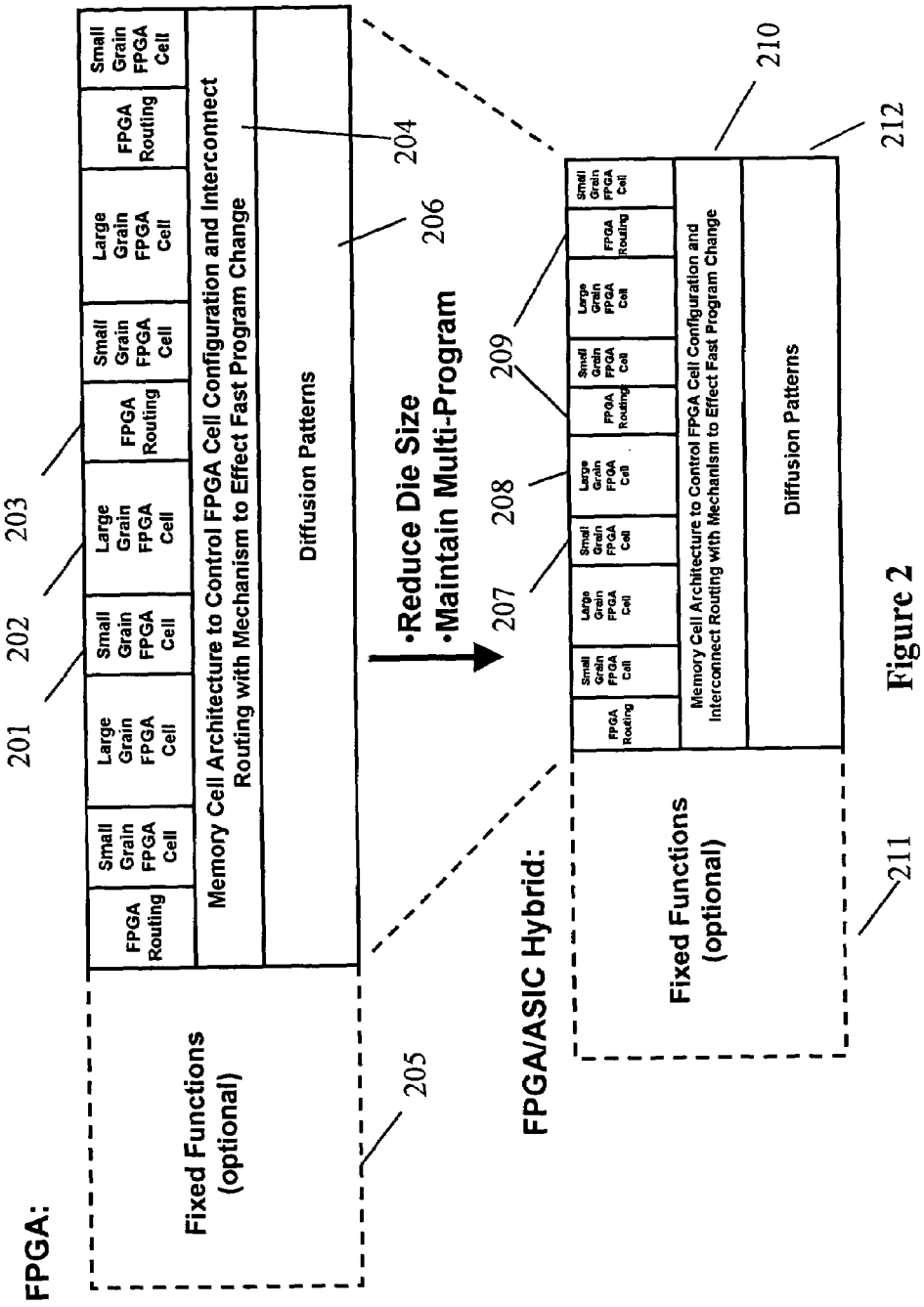
FIG. 2 shows how a design implemented in a multi-program FPGA fabric can be migrated to an ASIC equivalent having a smaller die size while retaining the multi-program capability.

FIG. 2 shows how a specific application design first implemented in the multi-program FPGA fabric of FIG. 1 can be migrated to a more silicon-efficient implementation where some of the FPGA cell and routing functionality is implemented in mask-configured ASIC technology, resulting in a form of hybrid FPGA/ASIC implementation. Note that such an implementation can be constructed as a full custom implementation on a custom or Standard Cell platform where all semiconductor masks are custom, or can be constructed using a semi-custom approach (to be described later in more detail) where a smaller number of FPGA connection point switches are used, and ASIC-style hard-wired routing is used for some number of final metal layers—essentially forming a hybrid FPGA/ASIC interconnect structure.

In the initial, fully programmable implementation, FPGA logic Cells 201 and 202 as well as FPGA Routing 203 contain the full flexibility of the FPGA technology utilized. Note that large grain cells 202 could represent or be used to implement multipliers. Configuration memory cells 204 contain the full complement of cells required to support all possible functionalities of the FPGA in two or more program configurations. Although this specification often utilizes a paradigm of multiple memory cells per FPGA programming/connection point, it should be understood that multiple FPGA programs may instead be implemented by employing special bus and circuit structures to enable fast reconfiguration where single memory cells control FPGA connection points and other programmable functions.

To achieve a lower device cost for higher volume production and/or to achieve lower power consumption, a specific multi-program user design may be migrated according to this invention to a Hybrid FPGA/ASIC implementation, where the required configuration memory cells are retained in order to implement each specific application (hence—"application specific") including the multi program (multi-personality) capability. Any connection points or logic functions that need not be programmable are deleted or hard-wired as appropriate, their configuration memory control cells also being deleted. Thus, FPGA Cells 207 and 208 may be reduced in size or otherwise simplified, and FPGA routing 209 will now comprise a combination of FPGA programmable routing connection points and hard-wired ASIC connections—a unique form of hybrid FPGA/ASIC. FPGA configuration memory cells 210 will now consist of a much smaller number of cells since only those actually required to implement the specific multi-program applications will remain. All other (unnecessary) cells have been deleted in the process of performing this migration. Note that any fixed functions 205 and 211 are usually identical in both the fully program multi-program FPGA fabric and the higher density, application-specific hybrid FPGA/ASIC fabric. These fixed functions may include, for example, software programmable (e.g. RISC or DSP) processors, memory (RAM and/or ROM), I/Os, PLLs, etc.

Note that this multi-program FPGA fabric and the migration method shown for increasing functional density can be employed in conjunction with any other functions fixed or programmable, or alternately can be implemented as a standalone FPGA device or an FPGA fabric embedded in an SOC (System on Chip) design—in all cases using the method described herein to migrate the multi-program FPGA fabric to a lower cost, higher density, higher performance implementation.

Figure 3:
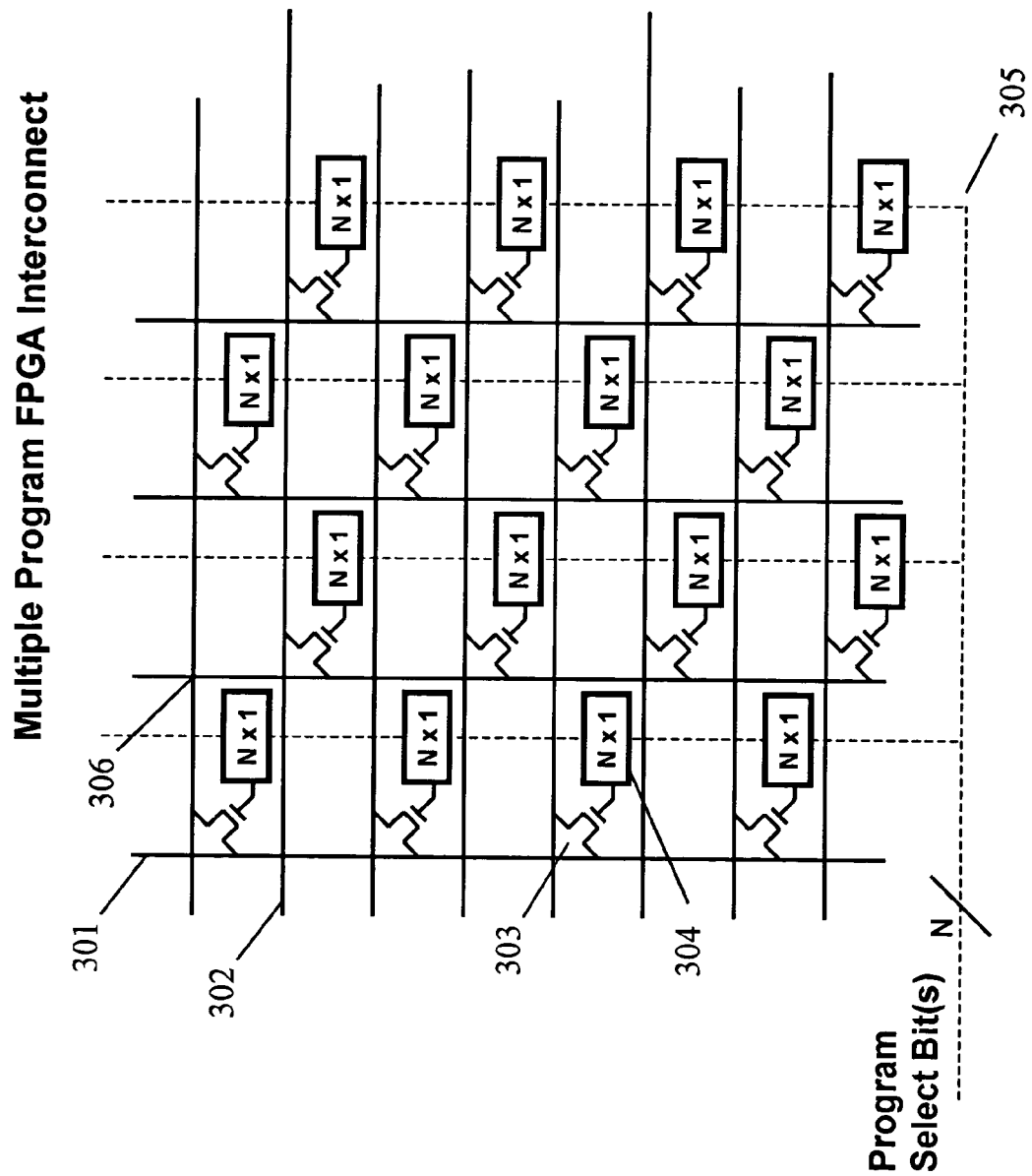
FIG. 3 shows a multi-program FPGA interconnect matrix with multi-location RAM cells controlling each programmable connection point in the matrix.

To further demonstrate the method of this invention for migrating a specific multi-program FPGA design to a hybrid FPGA/ASIC implementation, it is first useful to define an example FPGA interconnect matrix like the one shown in FIG. 3. FPGA interconnect matrices can be constructed in a variety of styles including a variety of connection point de-population schemes. FIG. 3 arbitrarily shows an interconnect matrix that is 50% populated. Here vertical routing lines 301 and horizontal lines 302 may be programmably connected by transistor pass-gates (switches) 303 that are controlled by RAM cells 304 that may or may not contain multiple locations per cell as discussed earlier. As also mentioned earlier, there are different styles of multi program configuration RAM cells that are utilized in reprogrammable hardware including variations on a "shadow" RAM structure, or employing special bus and circuit structures to enable fast reconfiguration where single memory cells control FPGA connection points and other programmable functions, or some combination if these techniques.

The multi-program RAM of FIG. 3 is a relatively simple implementation where one or more different programs are supported, each individual program being selected by (N) program selection bits 305 which supply the address for each RAM cell block 304. De-populated matrix intersection points like 306 have no transistor pass-gates nor configuration RAM cells. If multiple programming personalities are implemented by fast reconfiguration busses and structures instead of multiple memory locations per FPGA connection point, program selection bits 305 as shown in FIG. 3 may not be required.

Although the method described here focuses on the FPGA interconnect (which normally dominates silicon usage in a typical reprogrammable FPGA by a factor of approximately three to one over the logic cells), a similar scheme may be implemented within the FPGA logic cells, if those cells contain reprogrammable functionality. Some FPGA logic Cells, like well-known look-up table (LUT) are highly programmable and could be implemented as multi-programmable by substituting multiple location RAM blocks where a single RAM cell is normally used for configuration. In other implementations, some or all FPGA logic cells may have a fixed functionality such as a multiplexer or a multiplier. Other implementations may have a mixture of some logic cells that are programmable and some that are not. FPGA logic cells may also be quickly reprogrammed in some implementations by fast reconfiguration busses and structures.

Figure 4:
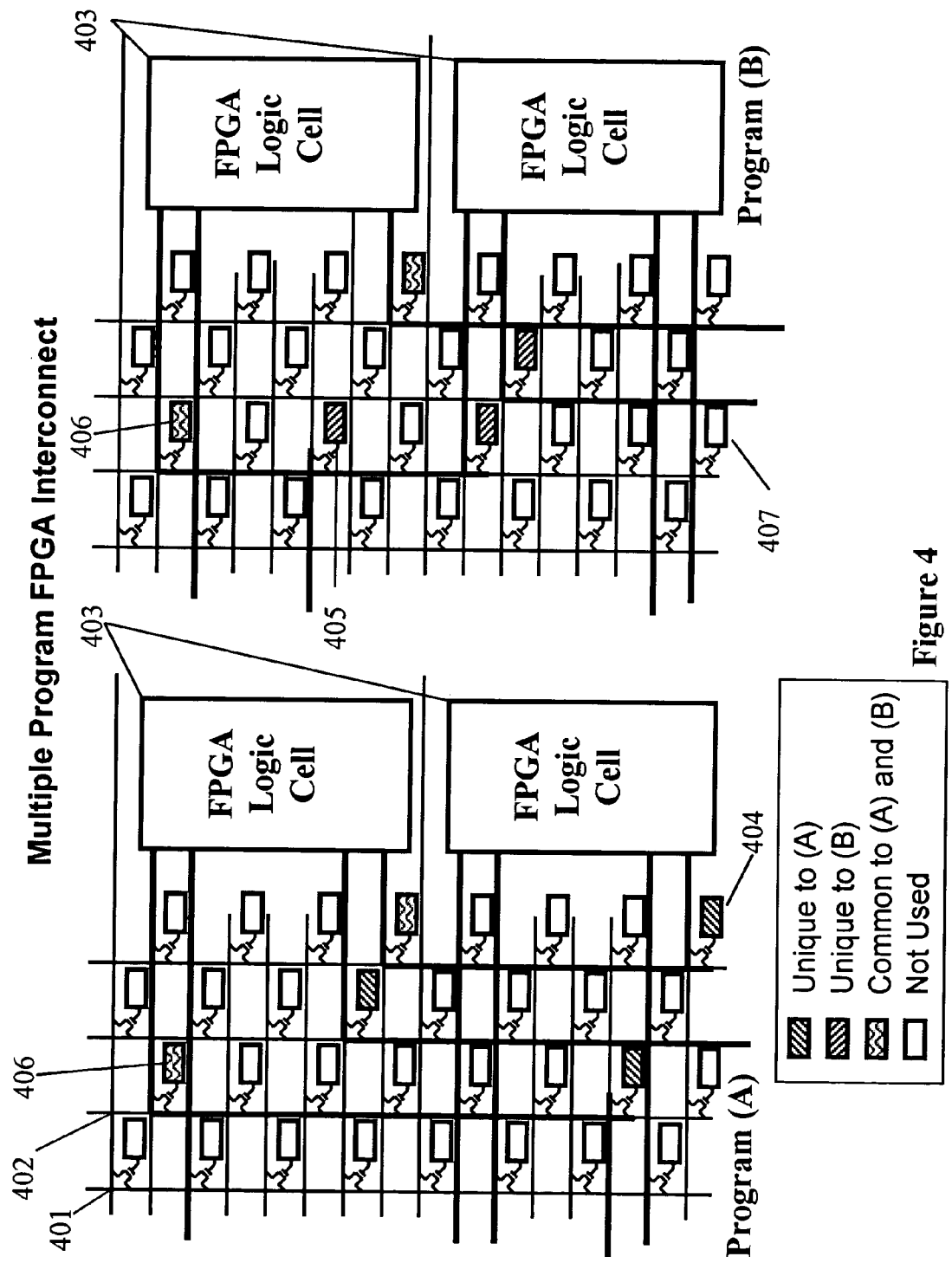
FIG. 4 shows how a multi-program FPGA interconnect matrix can be configured to implement two different connection functionalities.

To further describe how a multi-program FPGA implementation can be migrated to a hybrid FPGA/ASIC implementation according to this invention, it is appropriate to describe a simple example application with two different programs or personalities, such as that shown in FIG. 4. FIG. 4 contains two programs, A and B, that are applied to multi-program FPGA interconnect structures each containing populated matrix intersections 401 and de-populated matrix intersections 402. Notice that FPGA logic cells 403 may also contain some form of multi-program configuration mechanism where some consolidation might be performed in migrating a particular application design to a hybrid FPGA/ASIC implementation. Also, FPGA logic cells that are not used by either program A or program B will be deleted in the migration process. Connection cells that are common to all programs are usually implemented with fixed wiring as a result of the migration process.

If it is anticipated that a multi-program FPGA design might possibly be migrated to a hybrid FPGA/ASIC implementation, it is advantageous to first achieve a routing pattern for program A that has as many selected connection points as possible in common with those required for program B. This way, when the routing patterns for program A and program B are consolidated, the most efficient merging of resources will result. Although this is desirable, it is not required, and routing configurations for programs A and B with fewer connection points in common may be preferable if they result in higher performance.

The consolidation process requires identifying programmable connection points 406 that are common to both programs—essentially always requiring a connection to be made regardless of the program implemented. These can later be eliminated and turned into hard-wired connections. Also, programmable connection points 404 that are utilized only by program A, and programmable connection points 405 which are utilized only by program B, are identified. These must be retained as programmable connections in the consolidated implementation. All other programmable connection points 407, that are not utilized by either program are identified, and eliminated, in the consolidated implementation, representing the hybrid FPGA/ASIC.

Figure 5:
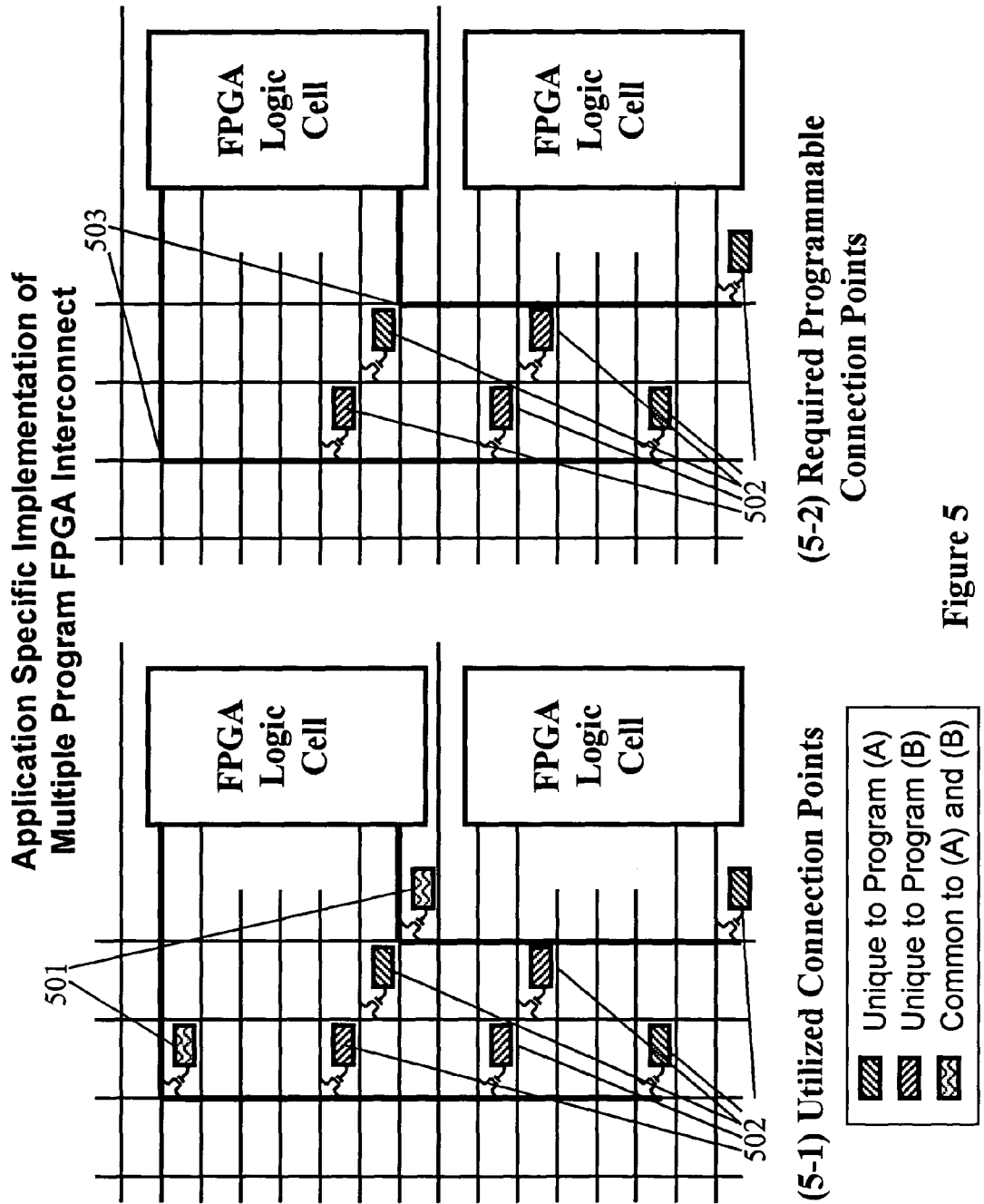
FIG. 5 shows how certain programmable connection points within a multi-program FPGA design are identified as part of the process of creating an ASIC equivalent having a smaller die size while retaining the multi-program capability.

FIG. 5 shows a similar view of the programmable connection points used by programs A and B where diagram 5-1 shows all programmable connection points that are used by either program and diagram 5-2 shows the programmable connection points 502 that must remain programmable in the consolidated (hybrid) implementation. As described earlier, connection points 501 that are used by both programs may be replaced by hard-wired connections 503.

Figure 6:
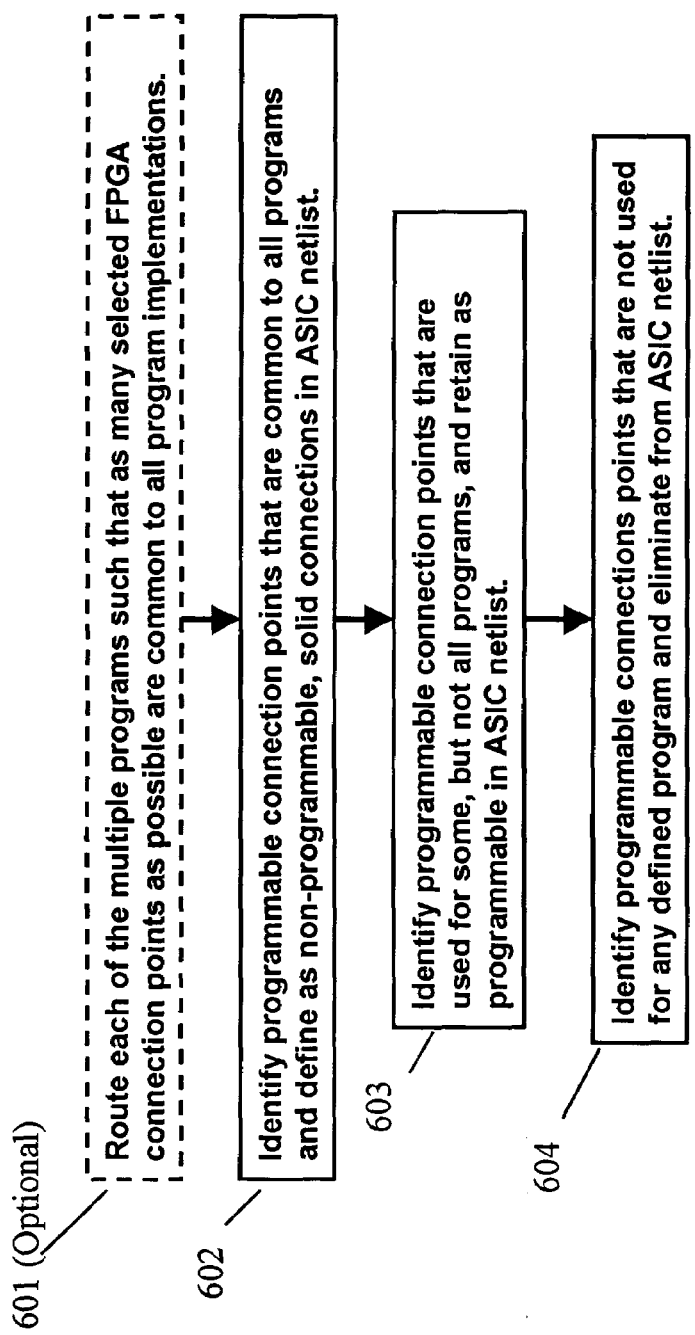
FIG. 6 shows a method for identifying and removing programmable connection points in converting a multi-program FPGA to an ASIC equivalent having a smaller die size while retaining the multi-program capability.

FIG. 6 describes a method for removing or altering programmable connection points when migrating (consolidating) a multi program FPGA design to a hybrid FPGA/ASIC implementation. Again, the focus is on reducing the silicon area required for interconnect since this is the dominant silicon area consumption factor for FPGAs. A similar method may be applied within the FPGA logic cells, if and where programmability exists.

The first-step, 601, is optional, and describes that the FPGA routing patterns for programs A and B in the initial implementation should have as many programmable connection points as possible in common. This can be accomplished in a variety of ways when the routing software is executed for programs A and B. One method would be to create a routing pattern for program A and then use this routing pattern as a starting point to create the pattern for program B. Some variation on a "rip-up and re-try" algorithm may be utilized here. Then, one could create a routing pattern for program B and then use this routing pattern as a starting point to create the pattern for program A. The results for the two exercises can then be compared, with that exhibiting the greatest number of common programmable connection points being kept as the preferred patterns. Of course the required performance and capacity requirements for the initial reprogrammable implementation must also be taken into account here.

In order to consolidate multiple programs such that they may be retained in the hybrid FPGA/ASIC, the next step 602 is to identify connection points that are common to all programs and define these as non-programmable, solid connections in the hybrid FPGA/ASIC netlist. Then, in step 603, connection points that are used for some, but not all programs are identified to be retained as programmable in the hybrid FPGA/ASIC netlist. Finally, in step 604, connection points are identified that are not used for any defined program, and these are eliminated from the hybrid FPGA/ASIC netlist. Typically this last category will comprise the majority of the connection points in the initial FPGA structure and will therefore account for the largest amount of silicon area reduction after the specific design has been migrated to the hybrid FPGA/ASIC implementation. The physical layout for an FPGA connection matrix is normally very regular. In the hybrid FPGA/ASIC implementation just described, the remaining programmable connection points, after de-population, may still be layed-out in a regular array if a custom or semi-custom layout is to be generated for the hybrid FPGA/ASIC implementation. Although the irregular wiring patterns required to connect the remaining programmable connection points may result in some loss of silicon area efficiency, the relatively large number of deleted, unused connection points will make the hybrid FPGA/ASIC a significantly smaller die nonetheless.

In addition to thinking of the Hybrid-FPGA solely as a way of merging multiple specific FPGA designs in order to programmably implement any of them, an additional step can be performed to add additional programmable routing switches such that variations in the design that are not yet known may be made after fabrication. This is especially useful for the semi-custom approach to be described in FIGS. 7 and 8 since the number of uncommitted switches is fixed when the base layers are fabricated, and after the final layer configuration has been performed, a number of uncommitted switches will normally still be uncommitted. These can, instead, be used for additional configurability for future, unanticipated changes. Whereas such future changes cannot be specifically anticipated, one could assume that the types of variations that are observed between the different programs of a multi-program FPGA might be the kinds of changes that would be needed in the future to implement yet another variation. Therefore, in sprinkling additional wires and programmable switches around the layout for future changes, these observed variations can be a guideline for automatic software that computes how this is done. It is also known that some kinds of functions—like control logic and state machines—often need to change once a design is initially completed. It would therefore be useful to provide additional wires and programmable switches within the portions of the layout that implement these types of functions.

Notice that in a Hybrid FPGA, it is not only switches that may be left uncommitted. Logic modules (cells) may also be left uncommitted. This can allow additional, currently unknown functionality to be added at a later date. In effect with this architecture, a specific logic functionality may be initially implemented in ASIC fashion using some portion of the modules and hard-wired metal connections, but if changes are needed after construction, they may be implemented in the field by using some of the uncommitted logic modules and field programmable switches. This can allow some degree of ASIC "Bug fixes" to be performed in the field.

Figure 7:
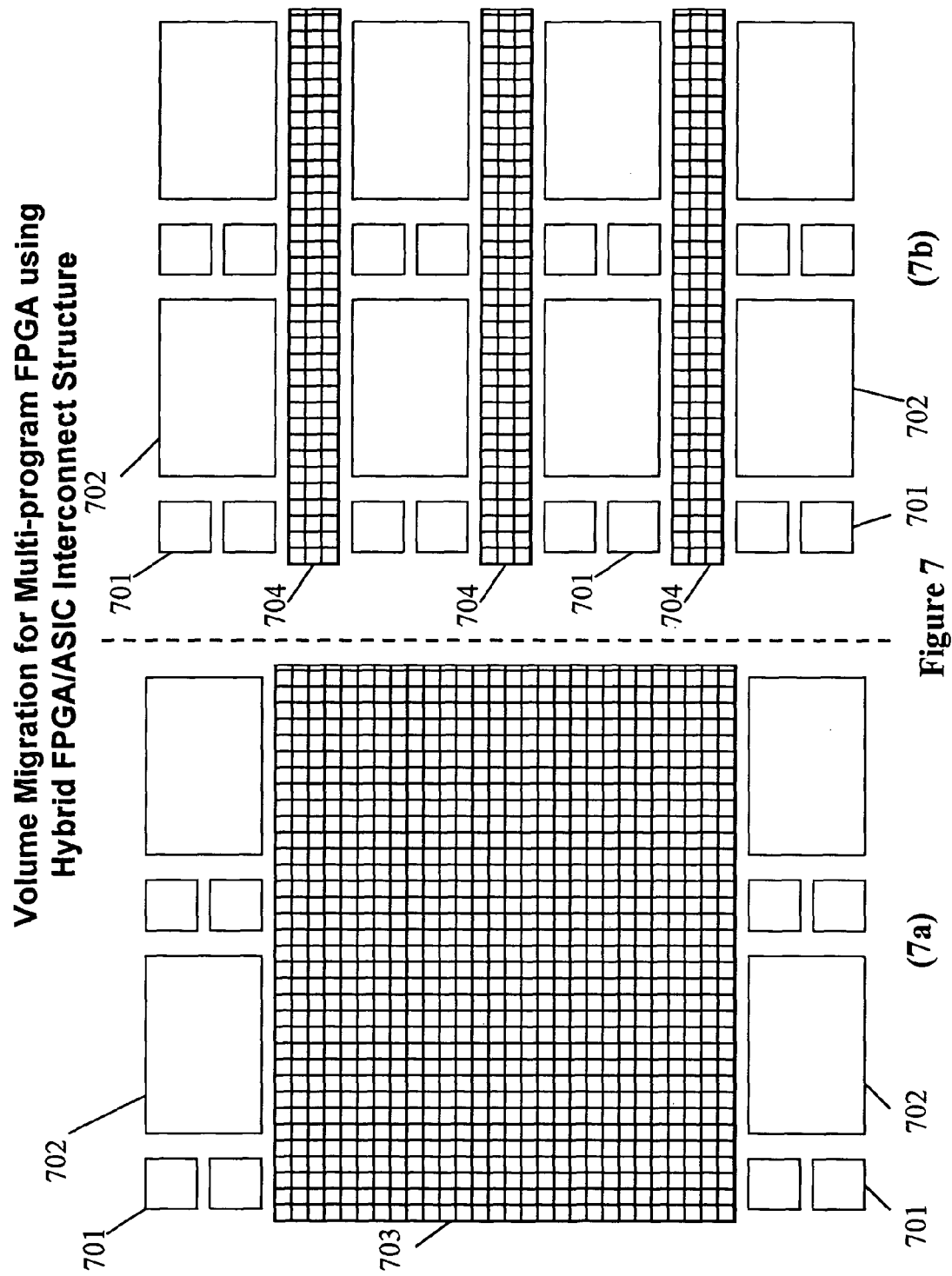
FIG. 7 shows logic modules and routing for both a general purpose multi-program FPGA (7a) and an application specific multi-program FPGA (7b) according to this invention.

An alternative to performing an all-layer custom implementation for the aforementioned hybrid FPGA/ASIC is shown in FIGS. 7 and 8. FIG. 7a shows an FPGA fabric with small grain logic cells 701 and large grain cells 702. Large grain cells 702 may represent or be utilized to construct multipliers where re-use of multipliers, from moment-to-moment, is desired. Programmable interconnect fabric 703 is understood to be designed for fast, moment-to-moment reconfigurability—either through fast reconfiguration busses and structures or multiple planes of configuration memory, or such combination of these and/or other mechanisms such that different logic programs can be implemented from moment-to-moment. FIG. 7b shows a hybrid FPGA/ASIC capable of implementing the same number of multiple logic programs through a like fast reconfiguration mechanism, except that these multiple programs will be fixed for a specific application. The device of FIG. 7b is also a semi-custom device, meaning that wafers containing such devices may be prefabricated to a certain level in the semiconductor process as a generic wafer suitable for all customers, a few final masking and fabrication steps being required to customize a wafer for a particular application. Since the fabric or device reflected in the diagram of FIG. 7b will only support a specific set of programs for a specific application, the number of reprogrammable connection points and related configuration memory required 704 will be small compared to that of reprogrammable connection points and related configuration memory 703 of FIG. 7a. This is due to the phenomenon demonstrated in FIGS. 4 and 5.

FIGS. 8a and 8b show cross-section diagrams for the fast reconfiguration FPGA of FIG. 7a and the fast reconfiguration hybrid FPGA/ASIC device of FIG. 7b respectively. Logic cells 806 and 807 are similar (or identical) to logic cells 801 and 802. If cells 801 and 802 contain configuration memory, then cells 806 and 807 may have a reduction in the amount of configuration memory in keeping with the purpose of this invention. All diffusion patterns and layers 805 and metalization layers 804 will be standard for the general purpose (standard product) device shown in FIG. 8a.

Notice that programmable interconnect fabric 808 in FIG. 8b consumes a much smaller amount of silicon area than interconnect fabric 803 in FIG. 8a. Also notice that some number of metal layers 811 in FIG. 8b are customized for the specific application with the remaining metal layers 810 and diffusion 809 being standard for all applications. This significant prefabrication of generic wafers is possible while still implementing the significant reduction in programmable connection points as demonstrated in the migration from the arrays shown FIG. 4 to those shown in FIG. 5. All connections common to the multiple programs required for a specific application will be implemented with custom metal wiring (811), while connections that must be altered to allow program changes will be implemented with a combination of custom metal wiring 811 and field reprogramming of configuration memory cells within interconnect fabric 808.

Therefore, methods and apparatus for implementing an application-specific multi-program FPGA fabric or device, have been described.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. A method for constructing an integrated circuit to implement custom logic functionality, comprising:

constructing diffusion and metal layers to construct a generic array of logic cells and field programmable switches, including a plurality of unconnected field programmable switches and unconnected logic cells; and choosing a netlist corresponding to a particular end-user application to be implemented; and completing the fabrication of said integrated circuit for the specific initial overall functionality of said particular end-user application by implementing in additional metal layers, a final connection layout with custom hard-wired metal connections between some of said unconnected logic cells and also incorporating custom hard-wired metal connections between some of said unconnected logic cells and said unconnected field programmable switches.

2. The method of claim 1, where said final connection layout also includes a plurality of uncommitted field programmable switches that are not required to implement said particular end-user application, such that alterations to the overall connectivity can be made in the field at a later time.

3. The method of claim 1, where said final connection layout also includes a plurality of uncommitted logic cells and uncommitted field programmable switches that are not required to implement said particular end-user application such that additional logic functionality can be field-programmably added to said initial overall functionality, such that alterations or additions to the overall logic functionality of said integrated circuit can be made in the field at a later time.

* * * * *

UNITED STATES PATENT AND TRADEMARK OFFICE
CERTIFICATE OF CORRECTION

| | | |
|---|---|---|
| PATENT NO. | : 7,093,225 B2 | Page 1 of 1 |
| APPLICATION NO. | : 10/639336 | |
| DATED | : August 15, 2006 | |
| INVENTOR(S) | : Robert Osann, Jr. | |

It is certified that error appears in the above-identified patent and that said Letters Patent is hereby corrected as shown below:

In the specification:

Column 1, lines 11-17 states:

"This application also claims the benefit of U.S. Provisional Application Ser. No. 60/396,375, filed on Jul. 17, 2002, entitled "Reprogrammable instruction DSP with multi-program FPGA fabric" (recently filed as a utility patent entitled "Reprogrammable instruction DSP" on Jul. 16, 2003) and commonly assigned with the present invention and incorporated herein by reference."

This should instead read:

--This application is a continuation in part of prior U.S. Nonprovisional Application 10/621,957 filed July 16, 2003 entitled "Reprogrammable Instruction DSP" which itself claims priority to U.S. Provisional Application Ser. No. 60/396,375, filed on Jul. 17, 2002, entitled "Reprogrammable instruction DSP with multi-program FPGA fabric". Application No. 60/396,375 is herein incorporated by reference.--

Signed and Sealed this

Twenty-second Day of July, 2008

JON W. DUDAS
*Director of the United States Patent and Trademark Office*